(12) United States Patent
Cai et al.

(10) Patent No.: US 10,103,156 B2
(45) Date of Patent: Oct. 16, 2018

(54) STRAP LAYOUT FOR NON-VOLATILE MEMORY DEVICE

(71) Applicant: GLOBALFOUNDRIES Singapore Pte. Ltd., Singapore (SG)

(72) Inventors: Xinshu Cai, Singapore (SG); Khee Yong Lim, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/434,072

(22) Filed: Feb. 16, 2017

(65) Prior Publication Data

US 2018/0233509 A1    Aug. 16, 2018

(51) Int. Cl.

| | |
|---|---|
| *H01L 27/115* | (2017.01) |
| *H01L 21/82* | (2006.01) |
| *G11C 16/04* | (2006.01) |
| *H01L 27/11* | (2006.01) |
| *H01L 27/11521* | (2017.01) |
| *H01L 21/8234* | (2006.01) |
| *H01L 27/11519* | (2017.01) |
| *H01L 27/11507* | (2017.01) |
| *H01L 27/11568* | (2017.01) |
| *H01L 27/11504* | (2017.01) |
| *H01L 27/1156* | (2017.01) |
| *H01L 27/11563* | (2017.01) |

(52) U.S. Cl.
CPC .... *H01L 27/11521* (2013.01); *G11C 16/0483* (2013.01); *G11C 16/0491* (2013.01); *H01L 21/823418* (2013.01); *H01L 21/823443* (2013.01); *H01L 27/1156* (2013.01); *H01L 27/11504* (2013.01); *H01L 27/11507* (2013.01); *H01L 27/11519* (2013.01); *H01L 27/11563* (2013.01); *H01L 27/11568* (2013.01); *G11C 16/0408* (2013.01)

(58) Field of Classification Search
CPC ......... H01L 27/11504; H01L 27/11507; H01L 27/11519; H01L 27/11521; H01L 27/1156; H01L 27/11563; H01L 27/11568; H01L 21/823443; G11C 2213/82; G11C 2213/79; G11C 2213/81; G11C 2216/24; G11C 2216/22; G11C 16/0408; G11C 16/0483; G11C 16/0491
See application file for complete search history.

(56) References Cited

U.S. PATENT DOCUMENTS 6,747,310 B2    6/2004  Fan et al.
9,842,844 B2    12/2017 Wu et al.

*Primary Examiner* — Thanhha Pham
(74) *Attorney, Agent, or Firm* — Horizon IP PTE LTD.

(57) ABSTRACT

A device and methods for forming the device are disclosed. The method includes providing a substrate prepared with a memory cell region and forming memory cell pairs in the cell region. The memory cell pair comprises of first and second split gate memory cells. Each memory cell includes a first gate serving as an access gate, a second gate adjacent to the first gate, the second gate serving as a storage gate, a first source/drain (S/D) region adjacent to the first gate and a second S/D region adjacent to the second gate. The method also includes forming silicide contacts on the substrate on the gate conductors and first S/D regions and exposed buried common source lines (SLs) in pick-up regions, such that increasing the displacement distance in the wordline and source line (WLSL) region to an extended displacement distance $D_E$ avoids shorting between the first offset access gate conductors and adjacent access gate conductors of the rows of memory cell pairs.

20 Claims, 20 Drawing Sheets

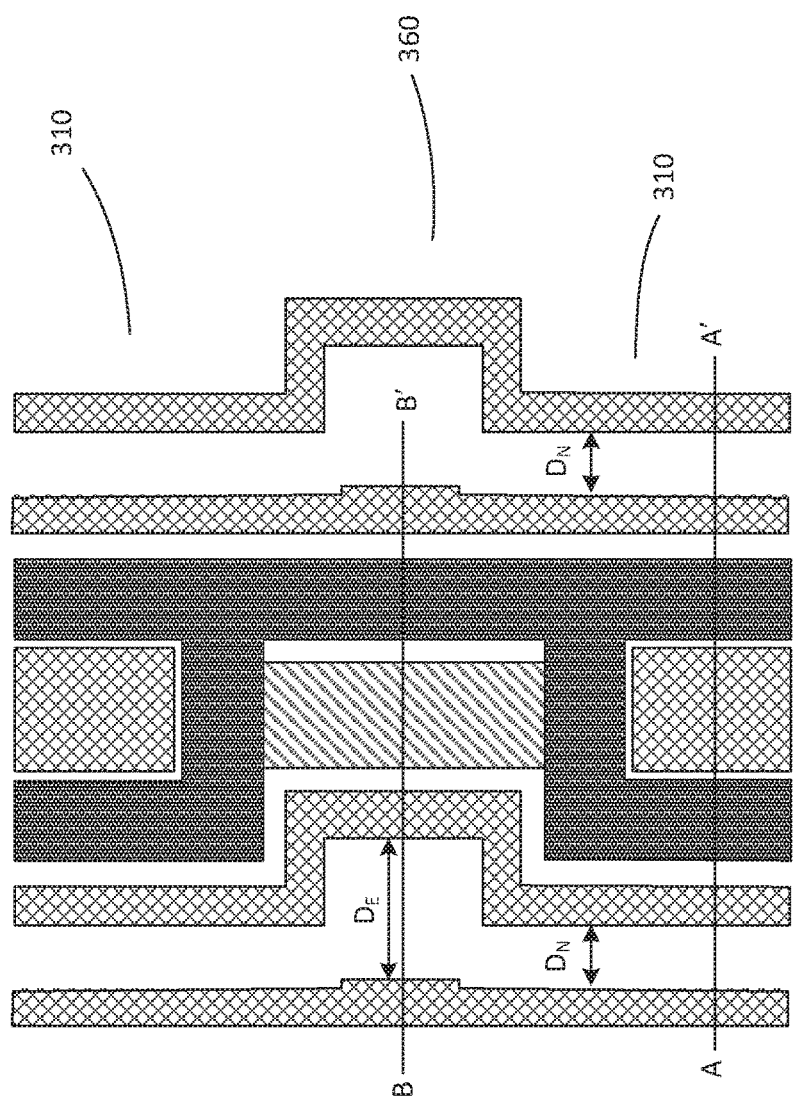

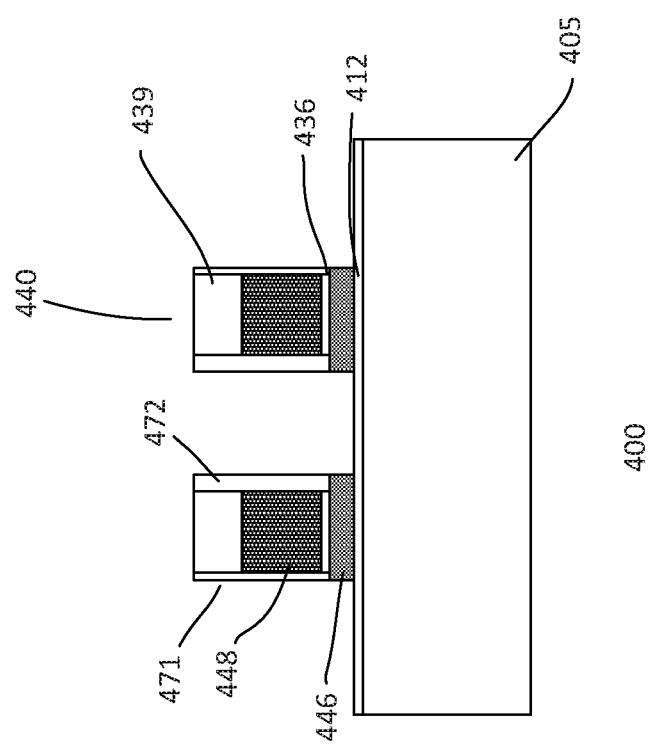

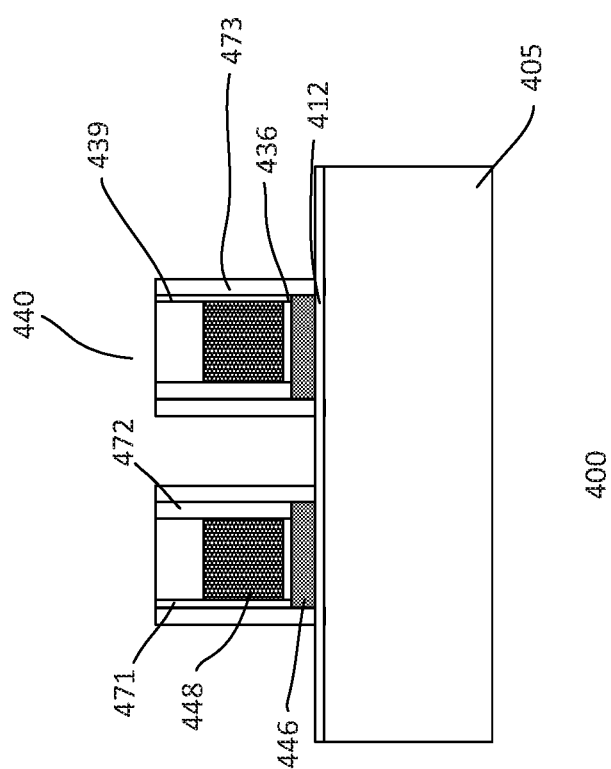

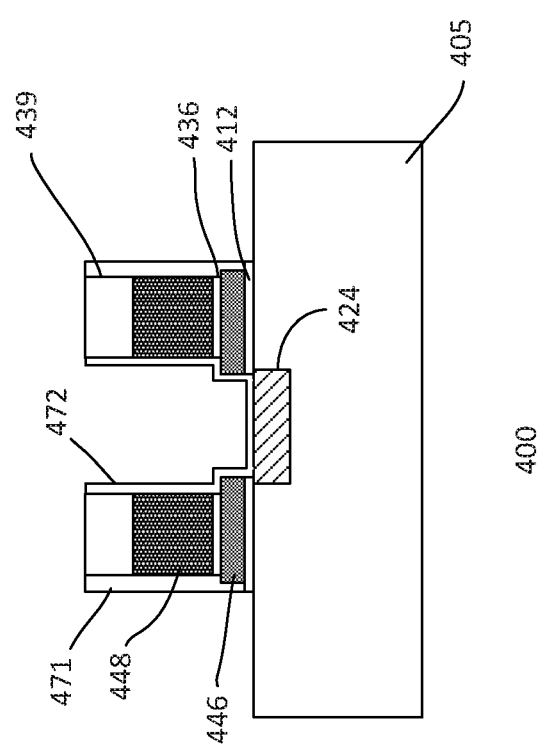

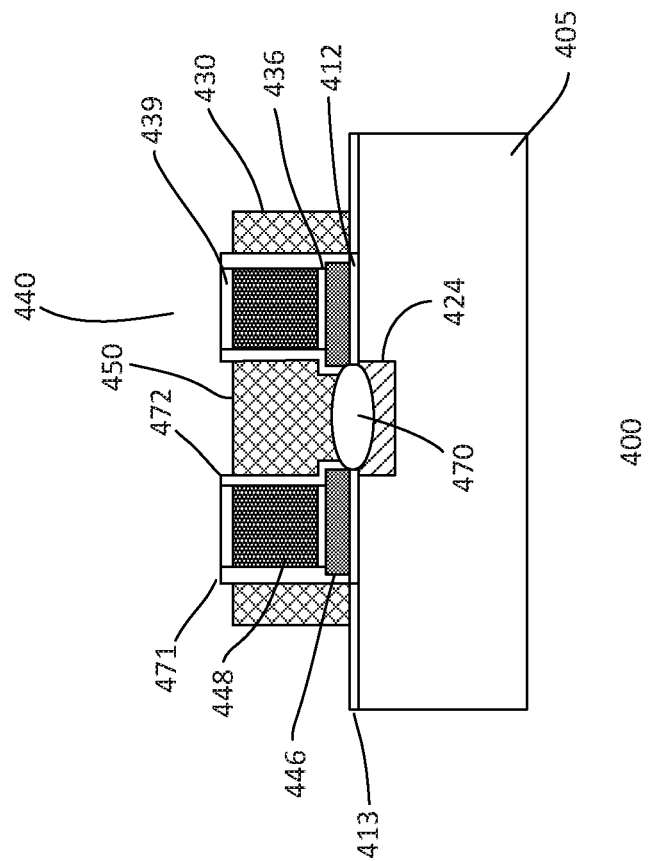

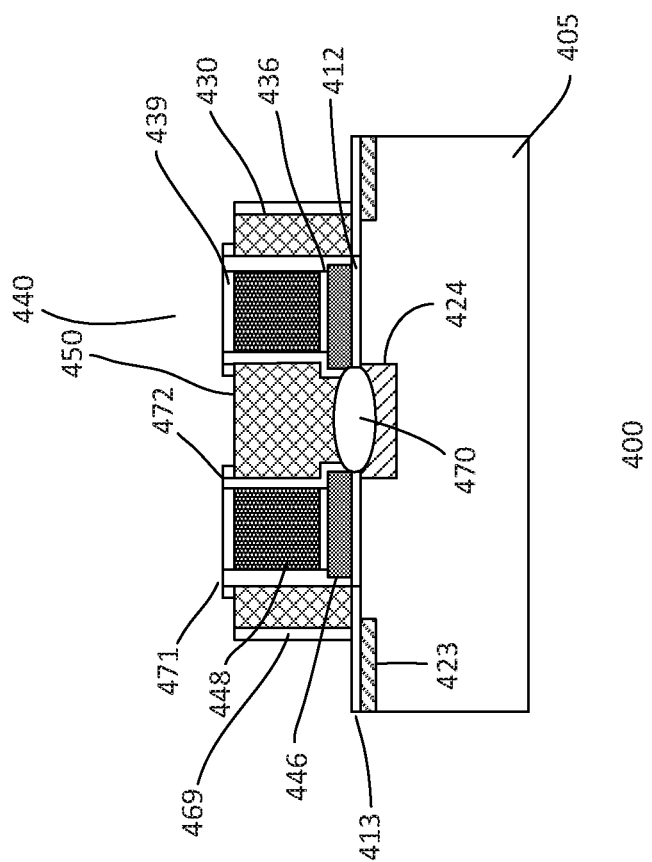

STRAP LAYOUT FOR NON-VOLATILE MEMORY DEVICE

BACKGROUND

Non-volatile memory (NVM) devices are able to retain stored data even when the power supply is interrupted. Non-volatile memory devices include flash devices which can be programmed using electrical signals. A NVM cell, for example, includes a memory transistor and a select or access transistor in series. The memory transistor stores data programmed into the memory cell, while the access transistor selects the memory cell to be programmed or erased.

The cells are interconnected to form a memory array. The various terminals of a memory cell, for example, are coupled to metal lines in interconnect levels. The connections to the metal lines are referred to as straps or pick-ups. As dimensions continue to reduce, so do distances between straps. For example, the distance of straps connecting adjacent access gates continues to shrink. In addition, the gate widths are increased at the strap region to accommodate contacts, further reducing the distance between access gates. The reduction or shrinkage in distance may cause shorting between adjacent access gates. To avoid shorting, the distance between adjacent access gates may be increased. However, this disadvantageously leads to increased device size.

The present disclosure is directed to a memory cell with strap layout which avoids shorting without increasing device size.

SUMMARY

Embodiments generally relate to semiconductor device and method for forming a device. In one embodiment, a method for forming a device is disclosed. The method includes providing a substrate prepared with a memory cell region and forming memory cell pairs in the cell region. The memory cell pairs are arranged in rows of memory cell pairs in a row direction and columns of memory cell pairs in a column direction. The memory cell pair includes first and second split gate memory cells. A memory cell includes a first gate serving as an access gate, a second gate adjacent to the first gate, the second gate serving as a storage gate, a first source/drain (S/D) region adjacent to the first gate and a second S/D region adjacent to the second gate.

The second S/D region is a common S/D region of the first and second memory cells of each memory cell pair. The second S/D region also extends a length of a row and serves as a common buried source line (SL) for the row of memory cell pairs. The access gate and storage gate include access and storage gate conductors extending the length of the row which forms common first and second gates of memory cells of the row of memory cell pairs. The memory cell pair further includes an isolation region which isolates memory cell pairs in the row and the column directions and a wordline and SL (WLSL) pick-up region in a row of memory cells.

The storage gate conductor of the first memory cells (first storage gate conductor) of the row of memory cell pairs includes first and second crossovers for coupling to the storage gate conductor of the second memory cells (second storage gate conductor) of the memory cell pairs. The first and second crossovers create a displacement area in the WLSL pick-up region without the first storage gate conductor. The access gate conductor of the first memory cells of the memory cell pairs (first access gate conductor) is offset towards the common buried SL to occupy the displacement area vacated by the first storage gate conductor. An adjacent access gate conductor of the first memory cells (first adjacent access gate conductor) of an adjacent row of memory cell pairs adjacent to the offset first access gate conductor includes a normal displacement distance $D_N$ in a non-WLSL region and an extended displacement distance $D_E$ in the WLSL region where $D_E$ is greater than $D_N$.

The method also includes forming silicide contacts on the gate conductors, the first S/D regions and exposed buried common SLs on the substrate in the pick-up regions. Increasing the displacement distance in the WLSL region to $D_E$ avoids shorting between the first offset access gate conductors and adjacent access gate conductors of the rows of memory cell pairs.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 3*a*-3*c* show top and cross-sectional views of an embodiment of a device.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as Universal Serial Bus (USB) or other types of portable storage units, or integrated circuits (ICs), such as microcontrollers or system on chips (SoCs). The devices or ICs can be incorporated into or used with, for example, consumer electronic products, or related to other types of devices.

Figure 1:
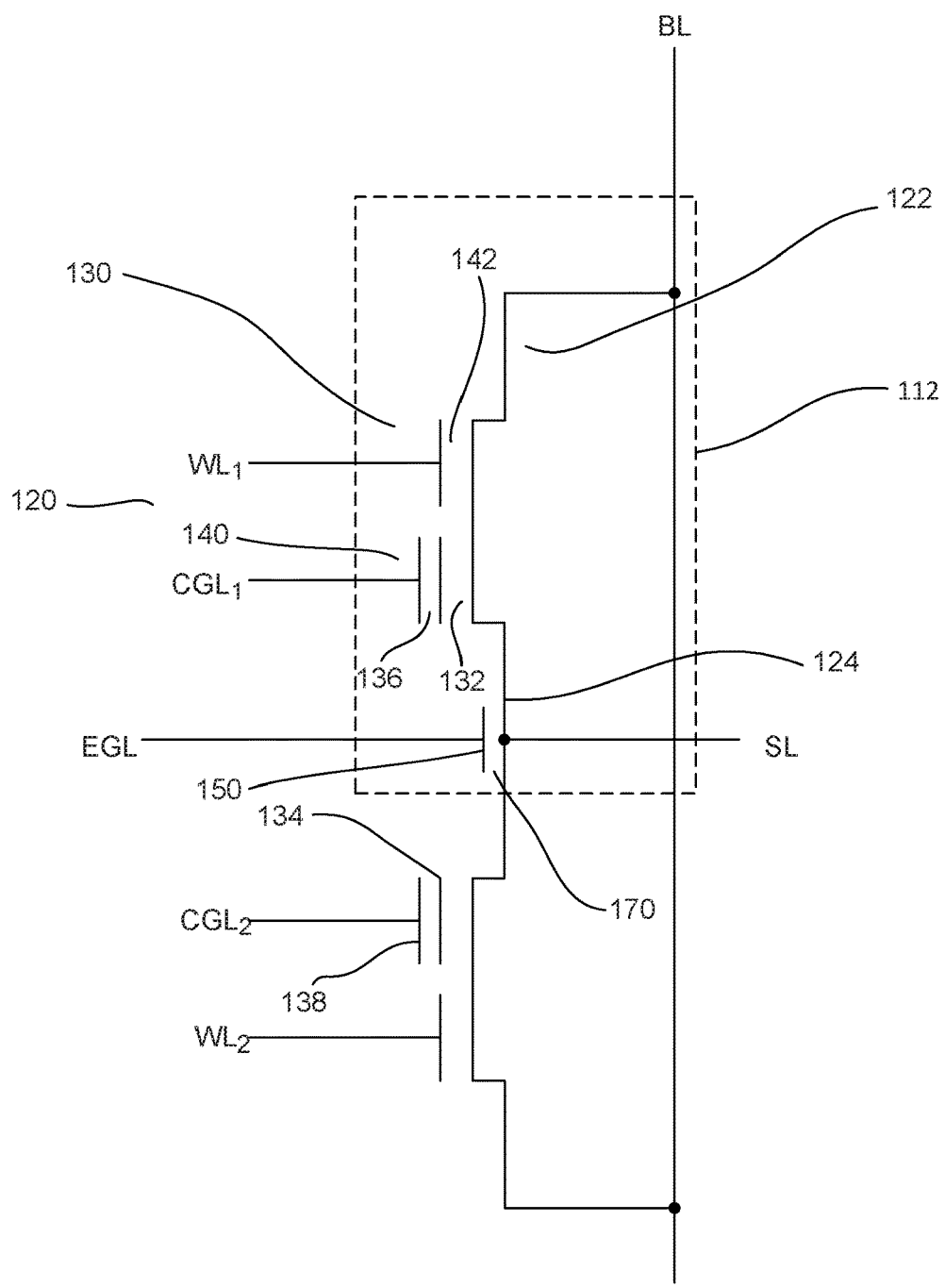
FIG. 1 shows a schematic diagram of an embodiment of a device.

FIG. 1 shows a schematic diagram of an embodiment of a device with a memory cell pair 110. For example, the memory cell pair includes first and second memory cells. The memory cells, in one embodiment, are NVM cells. Providing other types of memory cells may also be useful.

A memory cell 112 includes a cell transistor with a primary gate 120 between first and second terminals 122 and 124. The transistor may include a body (not shown). The body, for example, is a substrate. The substrate may be a semiconductor substrate, such as a silicon substrate. In one embodiment, the primary gate is disposed above the body or substrate while the terminals are disposed in the body. The primary transistor gate, in one embodiment, is a split gate. For example, the split gate includes first and second gates or primary gates 130 and 140. The first primary gate is adjacent to the first terminal and the second primary gate is adjacent to the second terminal.

The first primary gate 130 may be referred to as a select or access gate. As for the second primary gate, it may be referred to as a storage gate. The storage gate includes first and second storage gates 134 and 138. For example, the first storage gate is a floating gate and the second storage gate is a control gate 138. The different gates may be polysilicon gates. Other types of gates may also be useful. The gates need not be made of the same material. As for the terminals 122 and 124, they may be heavily doped regions in the body. Other types of terminals may also be useful.

The different gates may be separated by each other as well as from the body by an intergate dielectric. The intergate dielectric may include multiple dielectric layers which serve different purposes. For example, different portions of the intergate dielectric may serve as gate dielectrics, storage dielectrics or insulating dielectrics. The different portions may have different configurations. The dielectric layers may include silicon oxide, silicon nitride and/or silicon oxynitride. Other combinations of dielectric layers may also be useful.

In one embodiment, the floating gate 134 is separated from the body of the transistor by a floating gate dielectric 132 and the control gate 138 is separated from the body of the transistor by a storage gate dielectric 136. The access gate 130 is separated from the body by an access gate dielectric 142. The access and floating gate dielectrics may be the same dielectric layer. Side wall dielectrics may be provided to separate the first and second gates from each other. The sidewall dielectrics may be multiple side wall dielectrics, forming sidewall dielectric stacks. As for the storage gate dielectric, it may be a storage dielectric stack. For example, the storage gate dielectric may be an oxide/nitride/oxide (ONO) stack. Other configurations of intergate dielectrics may also be useful.

The control gate is coupled to a control gate line (CGL); the access gate is coupled to a wordline (WL). The first terminal is coupled to a bitline (BL). As for the second terminal, it is coupled to a source line (SL). In one embodiment, the second terminal is a common terminal of the memory cells of the memory cell pair. The second terminal serves as a source line (SL).

The transistor includes a secondary gate 150. The secondary gate serves as an erase gate. The erase gate is provided over the second terminal. The erase gate is separated from the second terminal by an erase gate dielectric 170. The erase gate dielectric, for example, may form a part of the intergate dielectric. The erase gate dielectric, in one embodiment, includes a thermal dielectric, such as thermal silicon oxide. Other types of erase gate dielectrics may also be useful. The erase gate 150 is coupled to an erase gate line (EGL).

As illustrated, the memory cells of the pair share a common EGL and SL. For example, the second terminals of the first and second cell transistors form a common second terminal and the erase gate is a common erase gate for the first and second cell transistors. A first wordline ($WL_1$) is coupled to the access gate of the first cell transistor and a first control gate line ($CGL_1$) is coupled to the control gate of the first cell transistor; a second wordline ($WL_2$) is coupled to the access gate of the second cell transistor and a second control gate line ($CGL_2$) is coupled to the control gate of the second cell transistor. As for the first terminals of the cell transistors, they are coupled to a common bitline (BL). For example, the cells of the memory cell pair are part of the same column of memory cells. Memory cells may be interconnected by wordlines (WLs), control gate lines (CGLs), erase gate lines (EGLs), source lines (SLs) and bitlines (BLs) to form a memory array.

Figure 2:
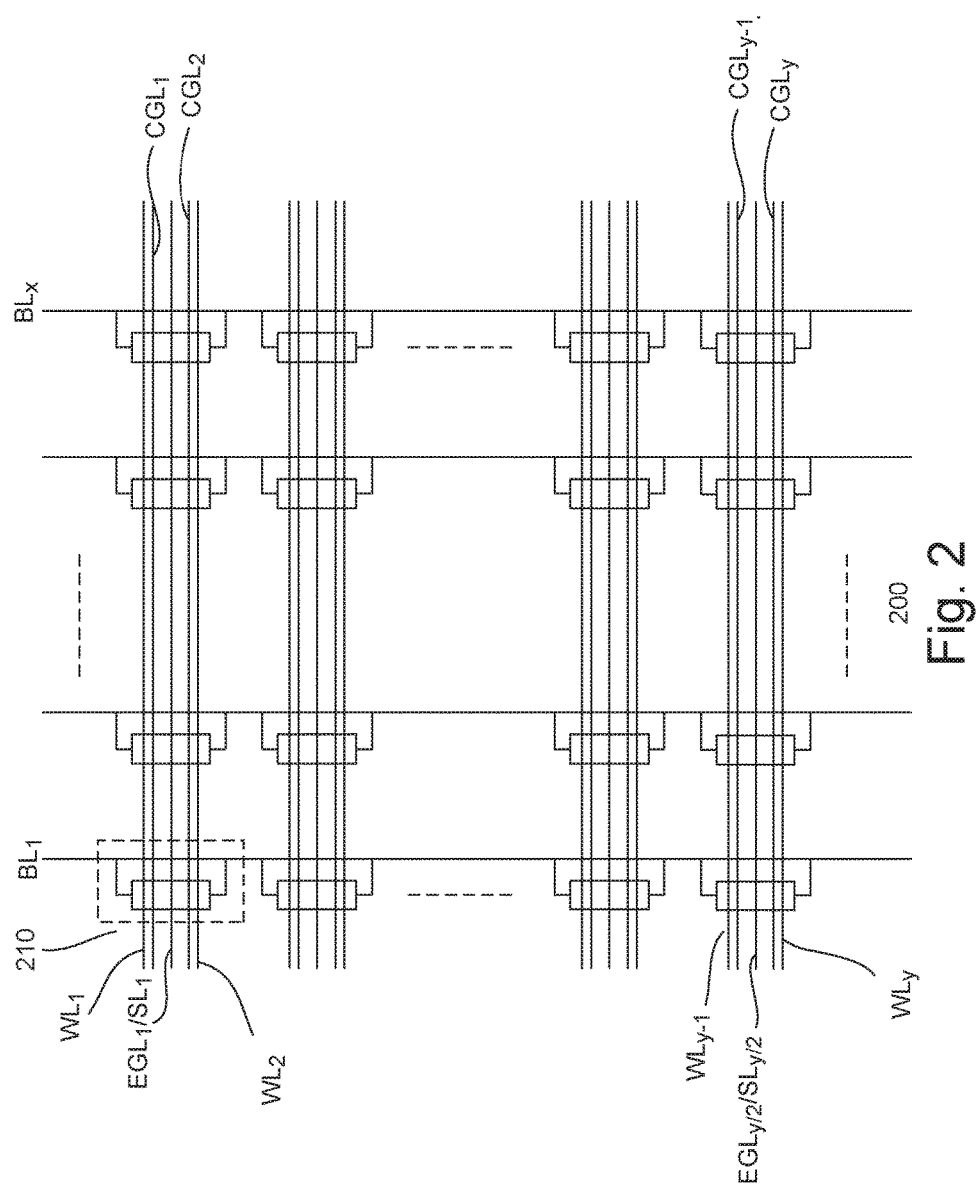
FIG. 2 shows an embodiment of a memory array.

FIG. 2 shows a plurality of memory cell pairs 210 configured to form a memory array 200. The memory cell pairs of the array are arranged in first and second directions. Memory cells are interconnected in the first direction by wordlines (WLs), control gate lines (CGLs), erase gate lines (EGLs), and source lines (SLs) to form rows of memory cells and in the second direction by bitlines (BLs) to form columns of memory cells. As shown, the array includes y rows and x columns of memory cells. Since EGLs and SLs are common to a pair of memory cells, there are y/2 of EGLs and SLs.

Appropriate voltages may be applied to a memory cell via the BL, CGL, WL, EGL and SL to perform different memory operations. The different memory operations may include program, read and erase operations. Table I below shows exemplary biasing conditions of the memory array for selected and non-selected cells for different operations.

TABLE 1

| | Signal (V) | | | | | | | | | |
|---|---|---|---|---|---|---|---|---|---|---|
| | WL | | SL | | BL | | CGL | | EGL | |
| Operation | Sel | Un-sel | Sel | Un-sel | sel | Un-sel | sel | Un-sel | Sel | unsel |
| Read | $V_{CC}$ | 0 | 0 | $V_{ref}$ | $V_{ref}$ | 0 | $V_{CC}$ | 0 | 0 | 0 |
| Program | $V_t < V < V_{CC}$ | 0 | 4.5 | 0 | <1 | $V_{CC}$ | 10 | 0 | 4.5 | 0 |
| Erase | 0 | 0 | 0 | 0 | 0 | 0 | 0 | 0 | 10-12 | 0 |

The biasing conditions as shown in Table I are exemplary. Other suitable biasing conditions may also be useful. The bias conditions may change, for example, based on technology node.

Figure 3B:
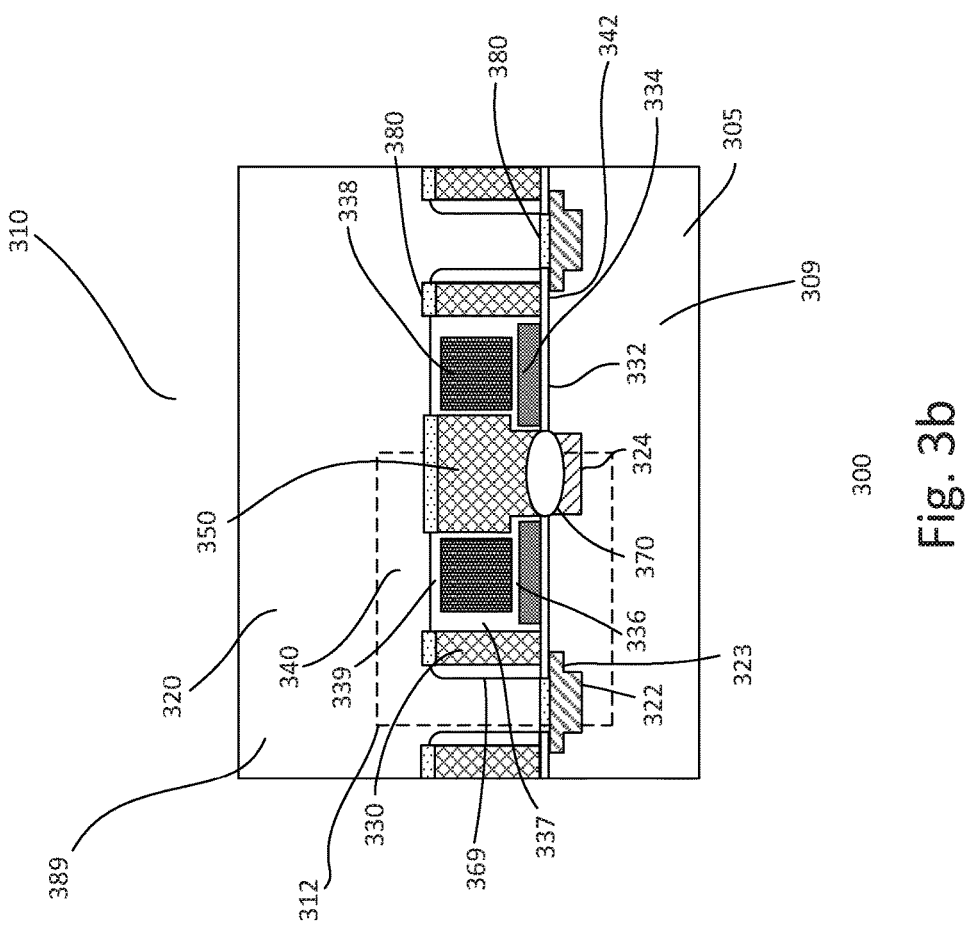
Figure 3C:
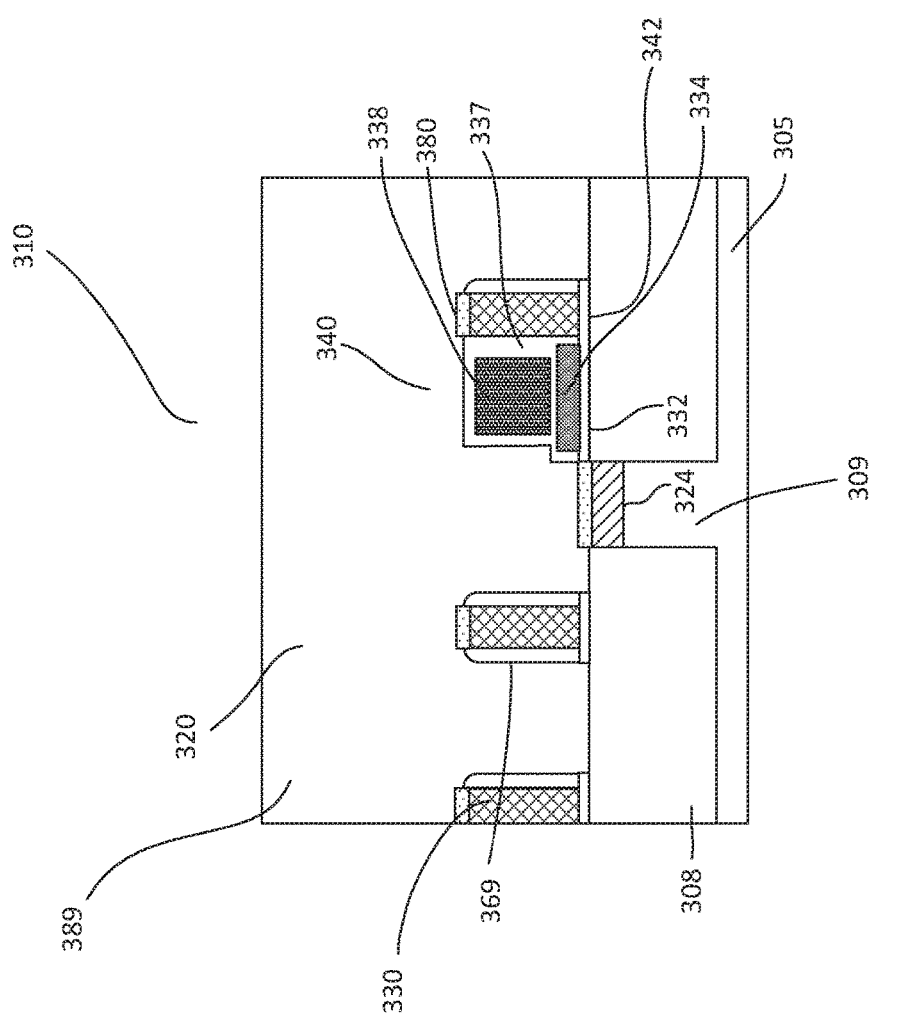

FIG. 3a shows a top view of an embodiment of a device 300. The top view shows a portion of a memory array which includes two memory cell pairs with adjacent access gates of adjacent memory cell pairs. The top view also includes a strap region 360. FIGS. 3b-3c show cross-sectional views along A-A' and B-B'. In particular, FIG. 3b is a cross-sectional view of a pair of memory cells and adjacent access gates while FIG. 3c is a cross-sectional view of the strap region.

Referring to FIG. 3a-3c, the device includes a substrate 305. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), medium voltage (MV) and low voltage (LV) devices.

As shown, the memory region includes two pairs of memory cells 310. The pairs of memory cells, for example, are from adjacent columns of memory cells. A pair of memory cells includes first and second memory cells 312. In one embodiment, the memory cells are NVM memory cells. Providing other types of memory cells may also be useful. The pair of memory cells may be adjacent memory cells of a column of memory cells. It is understood that the cell region includes numerous memory cells arranged in columns and rows to form a memory array. The array may be configured to have sub-arrays or sectors.

The array region may include a doped well 309 with dopants of a second polarity type. The doped well may be lightly or intermediately doped. For example, the doped well may have a dopant concentration of about 1E17 $cm^{-3}$-2E17 $cm^{-3}$. Providing a doped well having other dopant concentrations may also be useful. The dopant concentration, for example, may depend on the technology node. The doped well serves as the body of the transistors of the memory cells. The doped well may be a common doped well in the array region for the memory cells. In one embodiment, the array well is biased at an array well bias voltage ($V_{bias}$). In one embodiment, $V_{bias}$ is about 0 V. The second polarity type doped well serves as a well for a first polarity type device. In one embodiment, the second polarity type includes p-type. For example, the p-type doped well serves as a well for a n-type memory cell. Providing a n-type doped well may also be useful. For example, a n-type doped well serves as a well for p-type memory cells. P-type dopants can include boron (B), aluminum (Al), indium (In) or a combination thereof while n-type dopants can include phosphorus (P), arsenic (As), antimony (Sb) or a combination thereof.

The substrate includes isolation regions 308 to isolate active device regions from other active device regions, as required. The isolation regions, for example, are shallow trench isolation (STI) regions. Other types of isolation regions are also useful. For example, isolation regions may be used to isolate columns of memory cells. Other configurations of isolation regions may also be useful.

A memory cell includes a cell transistor with a gate 320 between first and second cell terminals or source/drain (S/D) regions 322 and 324. The gate, in one embodiment, is a split gate. For example, the split gate includes first and second gates 330 and 340. The second gate, for example, is a storage gate. The storage gate includes a control gate 338 and a floating gate 334. The gates, for example, are polysilicon gates. The gates may be formed by, for example, chemical vapor deposition (CVD). Other suitable types of gates or forming techniques may also be useful.

The gates are separated by an intergate dielectric. The intergate dielectric may include a plurality dielectric layers which may serve different purposes. For example, different portions of the integrate dielectric may serve as gate dielectrics, storage dielectrics, insulating dielectrics between the first and second gates or hard mask dielectrics. The different portions may have different configurations. For example, some may be a single dielectric layer while others may be a combination of layers. The dielectric layers may include silicon oxide, silicon nitride and/or silicon oxynitride. Other combinations of dielectric layers may also be useful.

In one embodiment, the access and floating gates 330 and 334 are separated from the substrate by a gate dielectric 332. As shown, the gate dielectric for both gates may be the same gate dielectric. Providing the gates with separate dielectrics may also be useful. The gate dielectric may be thermal silicon oxide. The gate dielectric may be about 60 Å-100 Å thick. Other types of dielectrics or thicknesses may also be useful.

As shown the control gate 338 is narrower than the floating gate. For example, the sides of the control gate are offset from the sides of the floating gate. In one embodiment, the offset of the control gate from a second side is greater than from a first side. The first side is adjacent to the first or access gate and the second side is adjacent to the second terminal and erase gate.

Separating the control and floating gates is a storage gate dielectric 336. The storage gate dielectric may be a storage dielectric stack. For example, the storage gate dielectric may be an oxide/nitride/oxide (ONO) stack. The ONO stack may be formed by, for example, CVD. The thickness of the ONO stack may be about 150 Å-160 Å. Other suitable types of floating gates or storage gate dielectrics, thicknesses, as well as forming techniques may also be useful.

A first integate sidewall dielectric 337 is disposed between the first and second gates. For example, the first intergate sidewall dielectric is disposed between the access gate and the floating and control gates. The first intergate sidewall dielectric may include a plurality of dielectric layers. For example, the first intergate dielectric layer may include a first control gate sidewall dielectric stack having a plurality of dielectric layers and a first floating gate sidewall layer.

The first control gate sidewall dielectric stack may include first and second first control gate sidewall dielectric layers (not shown). The first control gate sidewall dielectric layer may be a high temperature oxide (HTO) over on the sidewalls of the control gate and the second control gate sidewall dielectric layer may be a silicon nitride layer disposed over the first control gate sidewall dielectric layer. The thickness of the first control gate sidewall dielectric layer may be about 90 Å-100 Å and the thickness of the second control gate sidewall dielectric layer may be about 150 Å-160 Å. Other thicknesses may also be useful. The first control gate sidewall dielectric stack, for example, defines the offset of the control gate with respect to the floating gate on the first side of the storage gate.

As for the first floating gate sidewall layer, it may be a HTO layer. In one embodiment, the first floating gate sidewall layer extends the height of the second gate. For example, the first floating gate sidewall layer may be a spacer layer covering the first control gate sidewall dielectric stack and sidewall of the floating gate. The thickness of the floating gate sidewall layer, for example, may be about 180 Å-200 Å. Other thicknesses may also be useful. The thickness defines the isolation distance between the floating gate and the access gate.

A second intergate sidewall dielectric 339 is disposed between the first and erase gates. For example, the second intergate sidewall dielectric is disposed between the control and floating gates and the erase gate. The second intergate sidewall dielectric may include a plurality of dielectric layers. For example, the second intergate dielectric layer may include a second control gate sidewall dielectric stack having a plurality of dielectric layers and a second floating gate sidewall layer.

The second control gate sidewall dielectric stack may include first, second and third second control gate sidewall dielectric layers (not shown). The first control gate sidewall dielectric layer may be a high temperature oxide (HTO) over on the sidewalls of the control gate, the second control gate sidewall dielectric layer may be a silicon nitride layer disposed over the first control gate sidewall dielectric layer. The thickness of the first control gate sidewall dielectric layer may be about 90 Å-100 Å and the thickness of the second control gate sidewall dielectric layer may be about 150 Å. Other thicknesses may also be useful. The first and second control gate sidewall dielectric layers of the second control gate sidewall dielectric stack may be similar to that of the first control gate sidewall dielectric stack. For example, the first and second layers of the dielectric stacks may be formed from the same process. Other configurations of the control gate sidewall dielectric stacks may also be useful.

The third control gate sidewall dielectric layer may be a silicon oxide layer. For example, the silicon oxide layer may be formed by chemical vapor deposition (CVD). Other techniques for forming the third second control gate sidewall dielectric layer may also be useful. The thickness of the third second control gate sidewall dielectric layer may be about 100 Å. Other thicknesses may also be useful. The second control gate sidewall dielectric stack defines the offset of the control gate from the floating gate on the second side. The offset, for example, improves erase performance.

As for the second floating gate sidewall layer, it may be a HTO layer. In one embodiment, the second floating gate sidewall layer extends the height of the second gate. For example, the first floating gate sidewall layer may be a spacer layer covering the first control gate sidewall dielectric stack and sidewall of the floating gate. The thickness of the floating gate sidewall layer, for example, may be about 160 Å. Other thicknesses may also be useful. The thickness defines the isolation distance between the floating gate and the access gate. In one embodiment, the second floating gate sidewall dielectric layer may be similar or formed from the same process as the first floating gate sidewall dielectric layer. Other configurations of the floating gate sidewall dielectric layers may also be useful.

The floating gate 334 is separated from the substrate 305 by a floating gate dielectric 332 and the control gate 338 is separated from the floating gate by a storage gate dielectric 336. The floating gate dielectric, in one embodiment, is a thermal oxide. As for the storage gate dielectric, it is an oxide/nitride/oxide (ONO) stack. The ONO stack may be formed by, for example, CVD. Other suitable types of floating gates or storage gate dielectrics as well as forming techniques may also be useful.

The storage gate 340 includes a hard mask layer 339 over it. For example, the hard mask is disposed over the control gate. The hard mask, for example, is silicon oxide. The hard mask, for example, may be formed by CVD. Other suitable types of hard mask or dielectric materials and forming techniques may also be useful.

As for the first gate 330, it serves as an access gate or wordline. The first gate is disposed adjacent to the storage gate and first cell terminal 322. An access gate dielectric layer 342, such as thermal oxide, is provided below the access gate and on the substrate. The access gate or wordline, for example, may be polysilicon. The access gate may be formed by CVD. Other suitable types of access gates or forming techniques may also be useful. The storage gate and access gate may be gate conductors. For example, the gates form common gates for a row of memory cells.

The first and second S/D regions 322 and 324 are heavily doped first polarity type doped regions. For example, first polarity type doped S/D regions are for first polarity type cell transistors. In one embodiment, the first polarity type is n-type for a n-type cell transistor. Providing p-type S/D regions may also be useful for p-type cell transistors. The dopant concentration of the S/D regions, for example, are about $4E19$ $cm^{-3}$-$5E19$ $cm^{-3}$. Other dopant concentrations may also be useful. The dopant concentration may vary depending on technology node.

In one embodiment, the first and second S/D regions are formed using different processes. For example, the second S/D region is formed first after patterning the second gate. As for the first S/D region, it is formed after forming the first gate, which is formed after forming the second gate. Other process flow sequences for forming the S/D regions may also be useful.

The first S/D region may be referred to as a drain and the second S/D region may be referred to as a source. Other designations for the S/D regions may also be useful. In one embodiment, the source serves as a buried source line (SL). In one embodiment, the memory cells of the cell pair share a common second S/D region or buried SL. For example, the source of the first and second memory cells of the memory cell pair is the same. Other configurations of memory cell pairs may also be useful. In one embodiment, the first S/D region may be a common S/D region with an adjacent memory cell pair in the same column. For example, first gates of adjacent memory cells of adjacent memory cell pairs in a column share the same first S/D region.

In one embodiment, the first S/D terminal includes a lightly doped drain (LDD) extension region 323. The LDD extension is a lightly doped first polarity type region which extends from the first S/D region to under the gate. The dopant concentration of the LDD extension region may be about $4E18$ $cm^{-3}$-$5E18$ $cm^{-3}$. A halo region may be disposed adjacent to the LDD extension region. The halo region may be a second polarity type dope region, which is opposite of the S/D and LDD regions. The dopant concentration of the halo region may be about $3E-18$ $cm^{-3}$. Other dopant concentrations for the LDD extension and halo regions may also be useful. The dopant concentration may vary depending on technology node.

The first S/D, LDD extension and halo regions may be formed using separate implant processes. In one embodiment, the S/D, LDD extension and halo regions may be formed using the same implant mask but different implant processes. The LDD extension and halo regions may be formed using quad tilt angled implants. The first S/D region may be formed using a vertical implant. As for the second S/D region, it may be formed using a different implant process with a different implant mask.

A third gate 350 is disposed over the second S/D region or buried SL. The third gate serves as an erase gate. The erase gate, for example, is a polysilicon gate formed by CVD. Other suitable types of gate materials or forming techniques may also be useful. The erase gate is isolated from the buried SL by an erase gate dielectric 370. The erase gate dielectric, for example, is a thermal oxide layer. Other suitable dielectric materials may also be used as the erase gate dielectric. The thickness of the erase gate dielectric should be sufficient to electrically isolate the erase gate from the buried SL. An erase gate sidewall dielectric may be provided between the erase gate and second gate sidewalls. The erase gate sidewall dielectric, for example, may be an HTO dielectric layer and serves as a tunneling dielectric layer.

As shown, the erase gate is coplanar with the second or control gate. In some embodiments, the erase gate may be recessed. For example, a top surface of the erase gate is below the top of the second gate. Other configurations of the erase and second gates may also be useful.

A dielectric sidewall spacer 369 may be provided on the sidewall of the first gate adjacent to the first S/D region. In one embodiment, the dielectric spacer is a silicon nitride spacer. Other types of dielectric spacers may also be useful. For example, the spacer may be spacer stacks having multiple dielectric layers. To form the nitride spacer, a spacer layer may be formed and anisotropically etched, leaving spacer on the sidewall of the first gate. The spacer layer, for example, may be formed by CVD. Other techniques for forming the spacer may also be useful. In the case that the erase gate is recessed, the sidewall spacer may be disposed on the second gate exposed by the recessed erase gate.

The sidewall spacer serves to facilitate forming the first LDD region. For example, tilt implants are used to form LDD extension region and halo region, enabling them to extend below the spacer and part of the first gate. After forming the LDD extension and halo regions, a vertical implant is used to form the first S/D region. Other techniques for forming LDD extension, halo and first S/D region may also be useful.

Metal silicide contacts 380 may be disposed on exposed silicon portions of the memory cell. As shown, silicide contacts are disposed of the first S/D region and the first gate. No silicide is formed on the control gate 338 since it is covered by a dielectric hard mask layer. In one embodiment, silicide is disposed on the control gate 338 at the pick-up or the strap region. For example, the hard mask on the control gate at the pick-up is opened or removed to expose the control gate. The silicide contact may be a nickel-based silicide contact. For example, the silicide contact may be formed of nickel or nickel alloy. To form metal silicide contacts, a metal layer is formed over the substrate and annealed to cause a reaction with the metal and silicon. The reaction forms metal silicide. Excess unreacted metal is removed by, for example, a wet etch.

As shown, the cell transistors of the memory cell pair share a common second S/D region. Likewise, the cell transistors of the memory cell pair share a common erase gate. Other configurations of cell transistors of the memory cell pair may also be useful.

In one embodiment, the buried SL and first and second gates extend the length of a row. For example, the buried SL is a continuous diffusion region which extends the length of the row. Likewise, the first and second gates are gate conductors which extend the length of the row. For example, the buried SL, first and second gates are common for a row of memory cells. As for the erase gate, it is a discontinuous erase gate along the row. For example, the erase gate may be disconnected to form a plurality of erase gates of a row.

A dielectric layer 389 is disposed over the memory cells. The dielectric layer, for example, may serve as a contact level of an interlevel dielectric (ILD) layer. An ILD level includes a contact level and a metal level. For example, the dielectric layer serves as a contact level or CA level of the first ILD level or layer. Contacts (not shown) are formed in the CA level. Contacts in the CA level may be tungsten contacts for by, for example, damascene techniques. Other suitable types of contacts or forming techniques may also be useful.

A first metal level (not shown) of the first ILD level is disposed over the CA level. The first metal level (M1) includes conductive lines coupled to the contacts. The conductive lines, for example, are copper conductive lines. The conductive lines of M1, for example, may be formed by damascene techniques. Other suitable types of lines or forming techniques may also be useful.

Additional ILD levels (not shown) above the first ILD levels may be provided. For example, an additional ILD level x includes a contact level $V_{x-1}$ and a metal level $M_x$. Generally, an IC may have 5, 6 or 7 ILD levels, depending on the technology. Other number of metal levels may also be useful. Typically, the metal lines at the lower ILD levels may be 1× while upper levels may be wider, such as 2× or 6×. The metal lines and contacts in the additional ILD levels above M1 may be formed from copper using, for example, dual damascene techniques. Other configurations of metal lines and contacts for the additional ILD levels may also be useful.

In one embodiment, metal lines may be provided in metal levels which are coupled to various terminals of the memory cells. The terminals, for example, include access gates, control gates, drains and sources or buried SLs and erase gates of the memory cells. For example, metal wordlines (WLs) are coupled to access gates, metal control gate lines (CGLs) are coupled to control gates, metal SLs are coupled to buried SLs, metal bitlines (BLs) are coupled to drains, erase gate lines (EGLs) are coupled to erase gates. The lines may be provided in first (row) direction and second (column) directions. For example, WLs, CGLs, SLs, EGLs are disposed along the row direction for forming rows of memory cells while BLs are disposed along the column directions forming columns of memory cells. The metal lines in different directions are provided in different metal levels. Metal lines in the same direction may be provided in the same level. For example, metal lines in the row direction may be provided in M1 or M2 while metal lines in the column direction may be provided in M2 or M1. Providing the different metal lines in other configurations, such as other metal levels may also be useful.

The metal lines may be coupled to the various terminals of the memory cells by contacts in the CA level. For example, metal lines in M1 are coupled or stitched to the memory cell terminals by contacts in the CA level. As for metal lines, they are stitched to the memory cell terminals in M2 via contacts in V1, interconnects in M1 and contacts in the CA level. In one embodiment, contacts are stitched to the memory cell terminals in strap regions. For example, BLs are coupled to drains at BL strap regions, WLs are coupled to access gates at WL strap regions, CGLs are coupled to control gates at CGL strap regions, SLs are coupled to buried SLs at SL strap regions, EGLs are coupled to erase gates at EG strap regions. Except for BL pick-up regions, which are located at drains, the WL, CGL, SL and EGL pick-up regions may be located anywhere along the row direction since they extend the length of the row.

In one embodiment, the WL and SL (WLSL) strap regions 360 are located in the same location along the row direction while EGL and CGL pick-up regions (not shown) are located in different locations along the row direction. In one embodiment, the control gate conductors are configured in the WLSL strap regions to provide additional spacing between adjacent access gate conductors of adjacent memory cell pairs. It is understood that there may be more than one strap region per row. The number of strap regions, for example, may depend on design requirements, such as performance and length of a row.

In one embodiment, control gate conductors (including the floating gate conductors) of adjacent memory cells sharing a common buried SL are coupled together. For example, a first control gate conductor is coupled to the second gate conductor just prior to a WLSL strap region. This enables removal of the first control gate conductor in the WLSL stitching zone. Additionally, the erase gate is removed at the WLSL strap region to expose the buried SL. For example, the erase gate is disconnected at the WLSL stitching zones.

The removal of the control gate conductor provides space for the access gate adjacent to the first control gate conductor to be offset or displaced at the WLSL strap regions to occupy space vacated by the first control gate conductor. This increases the distance between the adjacent access gates conductors to $D_E$ from $D_N$ at the WLSL strap regions. By increasing the distance between access gate conductors to $D_E$ avoids shorting between the adjacent gate conductors.

Figure 4A:
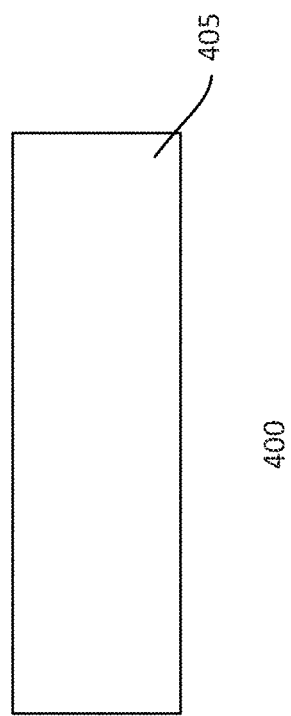
FIGS. 4*a*-4*o* show an embodiment of a process for forming a device.

FIGS. 4a-4o show cross-sectional views of an embodiment of a process 400 for forming a device. The cross-sectional views, for example, are along the bitline direction of the device. The device, for example, is similar to that described in FIGS. 1, 2 and 3a-3c. Common elements may not be described or described in detail. The cross-sectional views illustrate a portion of the device. For example, the cross-sectional views illustrate a portion of the array region of the device. As discussed, the device may include other device regions (not shown), such as logic regions, including HV, MV and LV regions. The various regions include device wells for respective devices. For example, the array region includes an array well while HV regions include HV p wells for HV n-type devices and HV n wells for HV p-type devices, MV regions include MV p wells for MV n-type devices and MV n wells for MV p-type devices, and LV regions include LV p wells for LV n-type devices and LV n wells for LV p-type devices.

Referring to FIG. 4a, a substrate 405 is provided. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

Initial front-end-of-line (FEOL) processing is performed on the substrate 405. For example, the substrate is prepared with isolation regions (not shown), such as shallow trench isolation (STI) regions, defining active regions of the device. For example, exposed portions of the substrate not filled with isolation regions serve as active regions of the device. The active regions, for example, include array, HV, MV and LV regions. Other regions may also be included.

After forming the isolation regions, wells are formed in the substrate. For example, doped wells are formed in the array region and the logic region. The logic region, for example, may include HV, MV and LV regions. The wells may be formed by performing ion implantation using implant masks, such as photoresist. Different wells are formed using different implant processes.

Figure 4B:
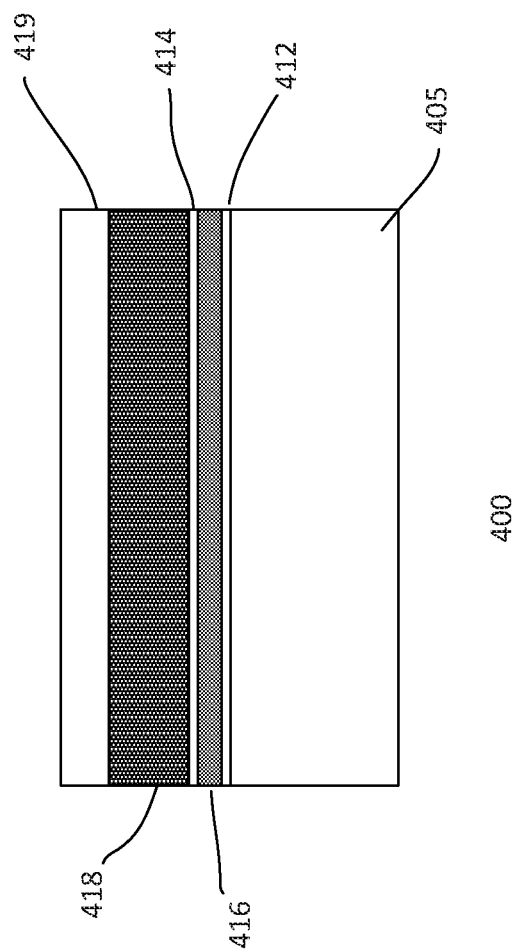

In FIG. 4b, various gate layers are formed on the substrate. This, for example, includes forming a floating gate dielectric layer 412, a floating gate electrode layer 416, a storage gate dielectric layer 414, a control gate electrode layer 418, and a hard mask layer 419. The floating gate dielectric may be a thermal silicon oxide layer while the storage gate dielectric layer 414 may be an ONO stack. As for the gate electrode layers, there may be polysilicon gate electrode layers formed by, for example, CVD. Other types of gate dielectric, storage dielectric and electrode layers or forming techniques may also be useful.

Figure 4C:
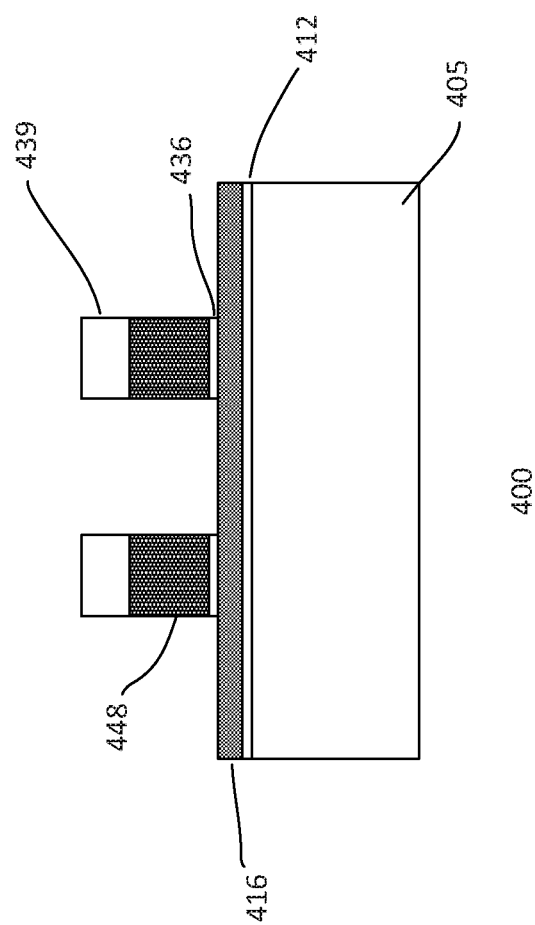

In FIG. 4c, the control gate and storage dielectric layers 418 and 414 are patterned to form control gates over the storage dielectric layer. For example, the hard mask is patterned using a patterned soft mask, such as a patterned photoresist layer. The photoresist layer may be patterned by exposing it with an exposure source through a reticle. The pattern of the reticle is transferred to the photoresist layer after development. For example, the patterned resist mask protects portions of the substrate corresponding to the control gate. In one embodiment, the pattern of the resist mask is configured to produce a control gate, as described in FIGS. 3a-3c.

An etch is performed to pattern the hard mask. The etch, for example, is an anisotropic etch, such as a reactive ion etch (RIE). After patterning the hard mask, the photoresist layer may be removed by, for example, ashing. The patterned hard mask 439 serves as an etch mask for patterning the control gate and storage gate dielectric layers 448 and 436. An over etch may be performed to ensure that the storage gate dielectric layer unprotected by the control gate is completely removed.

Illustratively, the portion of the array includes two control gates of a memory cell pair. It is understood that an array includes many more memory cell pairs which form columns and rows of memory cells.

Referring to FIG. 4d, first and second control gate spacers 471 and 472 are formed on first and second sidewalls of the control gates. The spacers may be dielectric spacers. For example, a dielectric layer may be formed over the substrate by, for example, CVD. The spacer layer may be anisotropically etched, such as by RIE, to remove horizontal portions, leaving sidewall spacers. In one embodiment, the spacers are spacer stacks having multiple layers. In one embodiment, the spacer stack includes a nitride layer which is used to form a nitride spacer. An oxide layer is then formed over the nitride spacer. The oxide layer is then anisotropically etched oxide spacers over the nitride spacers. In one embodiment, the oxide spacer serves as sacrificial spacers which are subsequently removed.

A gate threshold voltage (Vt) adjustment implant may be performed for the wordline. The implant may be performed using an implant mask (not shown). For example, the implant mask may be a resist mask with openings to the region 440 where access gate or wordline is to be formed. The opening may also expose a portion of the control gate on the access gate side.

After the Vt adjustment implant, the sacrificial spacers on the access gate side of the control gates are removed. For example, the sacrificial spacers exposed by the implant mask are removed, leaving the nitride spacers below. Removal of the exposed sacrificial spacers may be achieved by, for example, a wet etch. This results in the first control gate spacers on the first sidewalls being thinner than the second control gate spacers on the second sidewalls. Thereafter, the implant mask is removed by, for example, ashing. Other suitable removal techniques may also be employed.

The control gate spacers serve as an etch mask for patterning the floating gate layer 446. For example, an anisotropic etch, such as RIE, is used to remove exposed portions of the floating gate electrode layer. As shown, the floating gate dielectric layer remains on the substrate. Removing the exposed portions of floating gate dielectric layer 412 may also be useful. This forms second gates of the memory cell pair. For example, this forms the storage gates of the memory cell pair. The pattern of the storage gate follows the pattern of the control gate, as shown in FIGS. 3a-3c.

In FIG. 4e, full spacers 473 are formed on sidewalls of the control and floating gates. For example, a dielectric layer, such as silicon oxide, is deposited on the substrate and anisotropically etched to form the full spacers. The silicon oxide layer may be a high temperature oxide (HTO) layer. Other types of dielectric layers may also be useful.

Figure 4F:
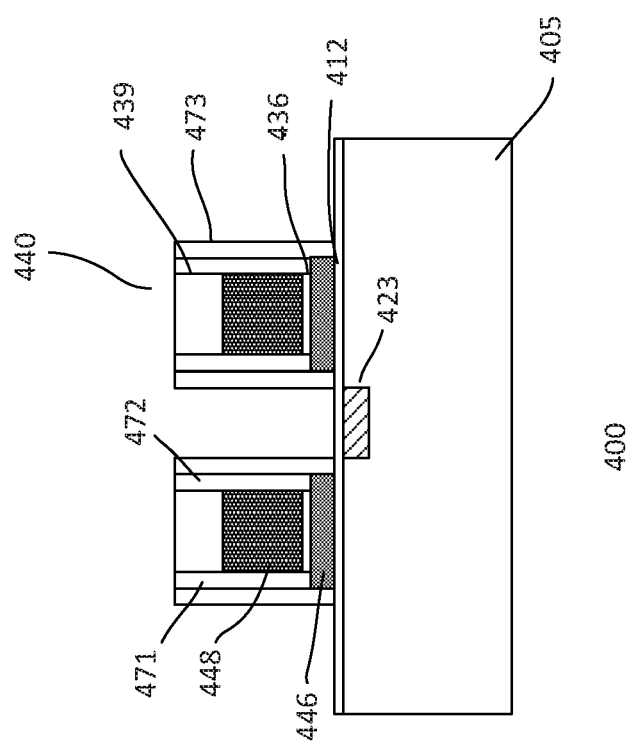

Referring to FIG. 4f, an implant is performed to form a source region 423 on the second side of the control gate. For example, an implant is formed between the second gates of the memory cell pair. The implant, for example, is a vertical implant. The implant implants first polarity type dopants to form a heavily doped source region. An implant mask (not shown), such as a photoresist mask, may be employed to provide an opening between the gates to form the source region. The source region, for example, serves as a buried SL. For example, the buried SL extends a length of a row of memory cells.

Referring to FIG. 4g, the sacrificial and full spacers on the second sidewalls are removed after the implant to form the source 424. For example, the sacrificial spacers and full spacers which are exposed by the implant mask are removed using, for example, a wet etch. The wet etch may also remove the dielectric layer on the surface of the substrate above the source. This leaves the nitride spacers on the second sidewalls of the control gate. The implant mask may be removed. For example, the implant mask may be removed by ashing. An anneal may be performed to activate and diffuse the source dopants, completing the formation of the source 424.

A tunnel oxide layer is formed on the substrate. The tunnel oxide, for example, is a HTO oxide. The HTO oxide layer is formed by, for example, CVD. After forming the tunnel oxide layer, a HTO anneal is performed to densify the oxide layer. The tunnel oxide is then patterned, leaving the tunnel oxide 472 lining the second gate sidewalls and over the source. The patterning is performed by mask and etch techniques. For example, a patterned mask, such as photoresist, is used as an etch mask to etch the tunnel oxide layer. The etch, for example, is an anisotropic etch, such as RIE. Other types of etches may also be useful. To ensure that the tunnel oxide completely lines the second sidewalls of the second gate, the mask may protect a portion of the second gate, leaving the tunnel oxide layer partially covering the second gate (not shown). The mask is removed after patterning the tunneling oxide layer.

Figure 4H:
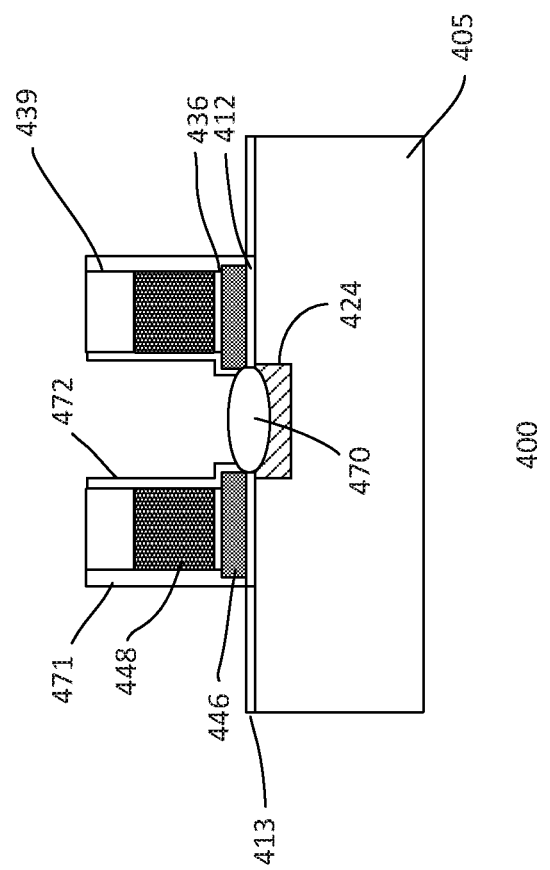

Referring to FIG. 4h, a WL gate dielectric layer 413 is formed on the substrate. The WL gate dielectric layer, for example, is a thermal oxide layer. In one embodiment, an erase gate dielectric 470 is also formed on the substrate over the source region. The erase gate dielectric, for example, is a thermal oxide layer. For example, the WL gate dielectric and erase gate dielectric may be formed in the same process.

Figure 4I:
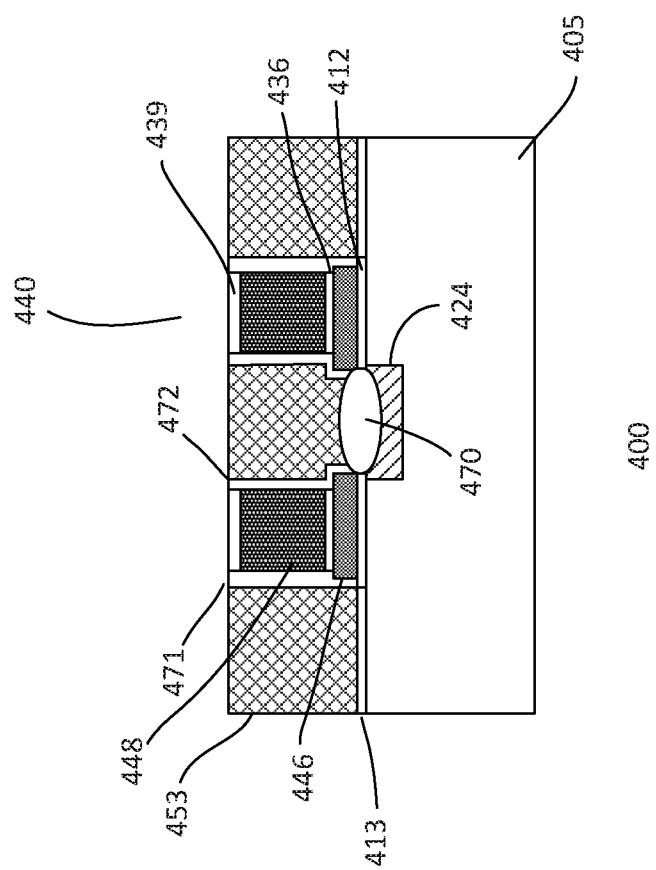

In FIG. 4i, a gate WL gate electrode layer 453 is formed on the substrate, filling the gaps between the second gates. Since the gaps follow the pattern of the second gates, so does the gate electric layer. The gate electrode layer, for example, is a polysilicon layer. The polysilicon may be doped polysilicon, for example, to reduce sheet resistance. The polysilicon may be doped with first polarity type dopants. The gate electrode layer may be formed by CVD. Forming the gate electrode layer by other techniques may also be useful. The substrate is planarized, removing excess gate electrode layer and forming a planar top surface, exposing the second gates. For example, a CMP is performed to planarize the substrate.

Figure 4J:
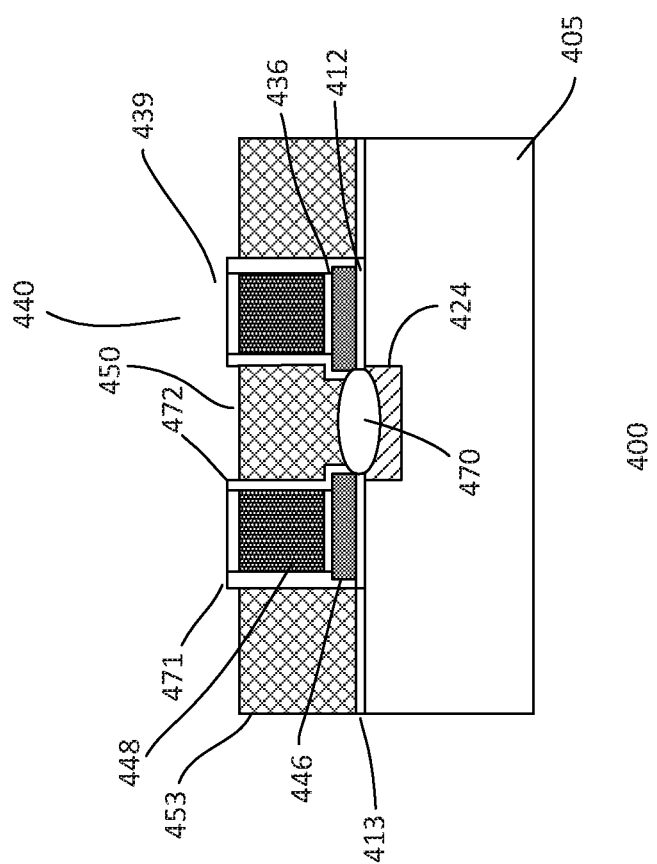
Figure 41:
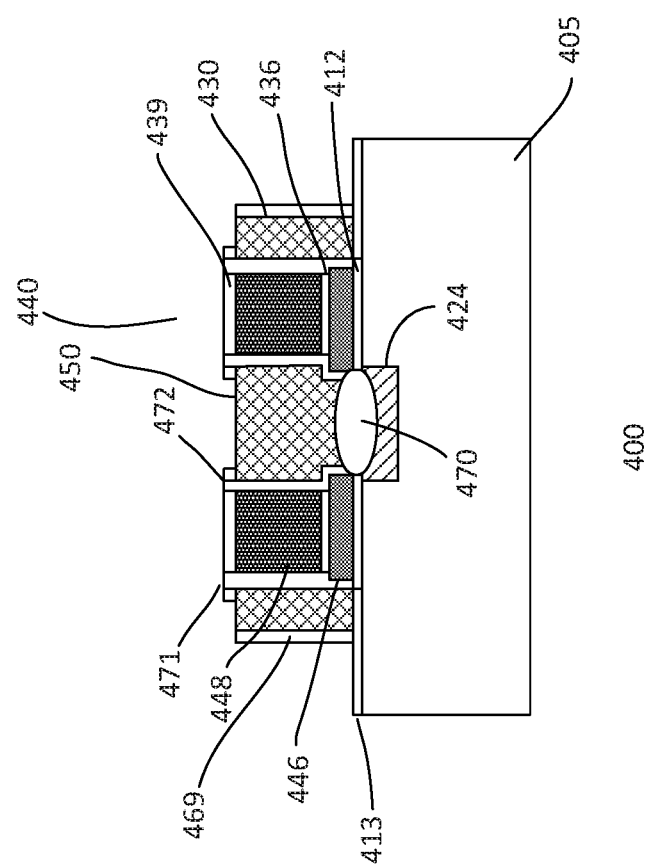

As shown in FIG. 4j, the WL gate electrode layer is recessed. For example, a height of the WL gate electrode layer is reduced to a desired height below the top of the second gate. An etch back is performed to recess the WL gate electrode layer to the desired height. As shown, the height of the WL gate electrode layer is recessed to about the interface of the hard mask and control gate. Recessing the WL gate electrode by other amounts may also be useful. In some embodiments, the WL gate electrode layer is not recessed depending on the technology node. In such case, the WL gate electrode layer maintains its coplanar top surface with the second gates. An erase gate 450 is disposed over the erase gate dielectric 470 between the second gates.

In FIG. 4k, the WL gate electrode layer is patterned to form access gates 430 of the memory cells. The access gates serve as WLs. In one embodiment, a mask, such as a resist mask, is employed to pattern the WL gate electrode layer to form the access gates. The mask protects the region over the erase gate 450, since it is already formed, and other regions where the access gates are to be formed. In one embodiment, the mask has a pattern to form access gates as shown in FIGS. 3a-3c. In addition, the mask includes an opening for pattern the erase gate in the WLSL strap zone, as also shown in FIGS. 3a-3c. The etch, for example, is a RIE.

After the access gates are formed, sidewall spacers 469 are formed on sidewalls of the access gates or wordlines and exposed portions of the storage gate as well as sidewalls of the logic gates, as shown in FIG. 4l. The sidewall spacers, for example, are nitride spacers. Other types of spacers may also be useful. The spacers, for example, are used to form lightly doped drain extension (LDD) regions.

Referring to FIG. 4m, an implant mask (not shown) is formed on the substrate. A LDD extension implant is performed. The implant forms LDD extension regions 423 in the drain regions adjacent to the first or access gates. The implant, for example, may be a tilt implant. In some embodiments, a halo implant may also be performed to form halo regions. The halo regions, for example, are second polarity type regions which extend beyond the LDD extension regions. The halo implant, for example, may be a tilt implant.

Figure 4N:
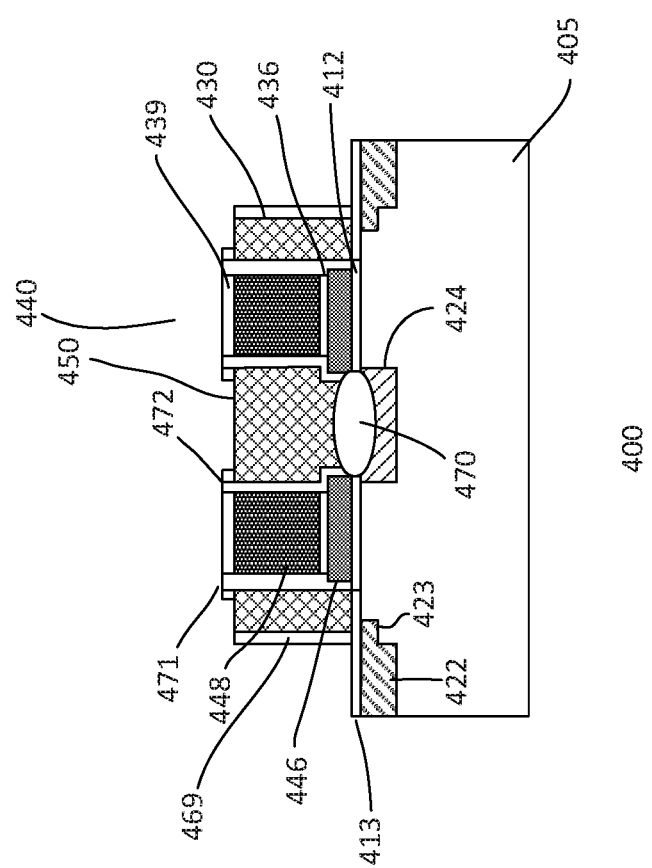
Figure 40:
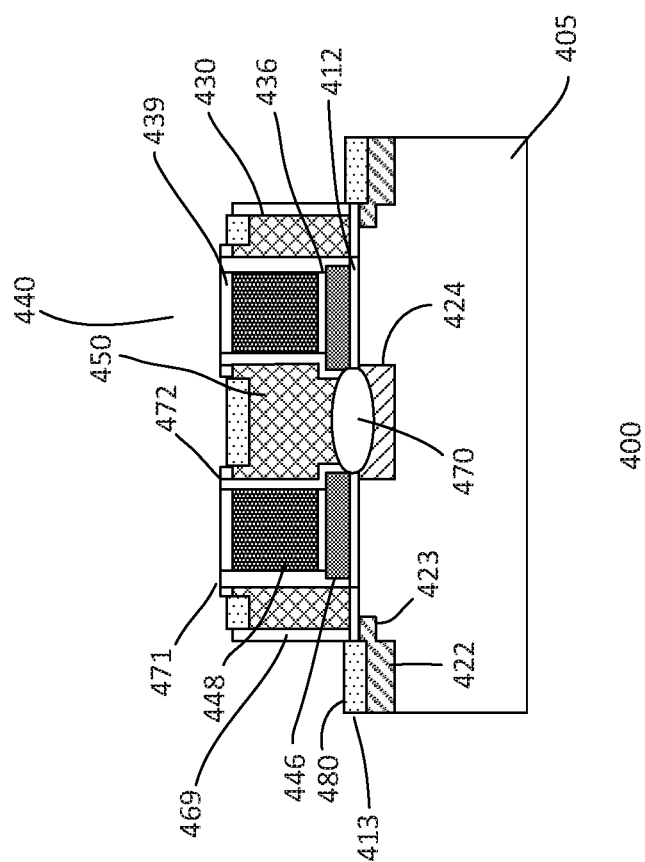

In FIG. 4n, a drain implant is performed. The drain implant, for example, is a vertical implant which implants first polarity type dopants. The implant forms first polarity type heavily doped drain regions 422 adjacent to the first or access gate.

Referring to FIG. 4o, the implant mask is removed. For example, the implant mask may be removed by ashing. Silicide contacts 480 are formed on exposed silicon portions of the memory cell. For example, silicide contacts are formed on the drain regions and access gates of the memory cells. The silicide contacts may be a nickel based silicide contact, such as nickel-alloy. To form the silicide contacts, a metal layer is formed on the substrate. For example, a metal layer may be formed on the substrate by sputtering. An anneal is performed to cause a reaction with the silicon. Unreacted metal is removed by, for example, a wet etch, leaving the silicide contacts.

The process continues with back-end-of-line (BEOL) processing to form interconnects and passivation. For example, a premetal dielectric (PMD) may be formed on the substrate covering the memory cells. Vias are formed in the PMD area, exposing silicide contacts at the pick-up regions. The vias are filled with conductive materials such as tungsten and planarized to remove excess materials to form via contacts. The process continues to form the first metal level as well as additional ILD levels and interconnect pads. Wafer level bumping may be performed to form external contacts. Other types of external contacts may be formed.

After BEOL is completed, the wafer is diced into individual chips. Other suitable processes may also be included.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for forming a device comprising:
forming first and second storage gate conductors of a row of memory cell pairs on the substrate disposed in a row direction, wherein the first storage gate conductor comprises first and second crossover regions at first and second sides of a wordline and source line (WLSL) pick-up region in the row direction, wherein the first and second crossover regions comprise the first storage gate conductor crossing over to merge with the second storage gate conductor, the WLSL pick-up region is devoid of the first storage gate conductor;
forming a common source/drain (S/D) region in the substrate between adjacent storage gate conductor sidewalls of the first and second storage gate conductors, the common S/D region extends a length of the row of the memory cell pairs, including under the first and second crossover regions and in the WLSL pick-up region, the common S/D region and serves as a common source line (SL) of the row of the memory cell pairs; and
forming first and second access gate conductors adjacent to non-adjacent storage gate conductor sidewalls of the first and second storage gate conductors, the first access gate conductor follows a sidewall profile of the non-adjacent sidewall of the first storage gate conductor and includes a first offset in the WLSL pick-up region which is adjacent to the common S/D region, the first offset is created by the absence of the first storage gate conductor in the WLSL pick-up region.

2. The method of claim 1 comprises:
forming a common erase gate of the row of the memory cell pairs between the first and second storage gate conductors over the common S/D region, the common erase gate comprises a discontinuation at the first and second crossover regions, leaving the WLSL region devoid of the common erase gate, thereby leaving the common S/D region uncovered by the common erase gate in the WLSL pick-up region; and
wherein the common erase gate is isolated from the common S/D region by an erase gate dielectric layer and the first and second storage gate conductors by first and second intergate dielectric layers.

3. The method of claim 2 wherein the row of the memory cell pairs further comprises:
first and second storage gate pick-up regions on the first and second storage gate conductors;
an erase gate pick-up region on the erase gate; and
wherein the first and second storage gate pick-up regions and the erase gate pick-up regions are disposed in locations along the row of the memory cell pairs which are different from a location of the WLSL pick-up region.

4. The method of claim 3 wherein the row of memory cell pairs comprises a plurality of WLSL pick-up regions, a plurality of first and second storage gate pick-up regions and a plurality of erase gate pick-up regions distributed in different locations along the row of memory cell pairs.

5. The method of claim 4 comprises:
forming a first S/D region in the substrate adjacent to the first access gate conductor of a first memory cell of each memory cell pair of the row of memory cell pairs; and
forming a second first S/D region adjacent to the second access gate conductor of a second memory cell of each memory cell pair of the row of memory cell pairs; and
wherein the first and second first S/D regions of each of the memory cell pairs serve as bitline pick-up regions.

6. The method of claim 5 comprises:
forming a contact dielectric layer over the memory cell pairs;
forming via openings in communication with the first and second access gates in the WLSL pick-up regions, the common S/D region in the WLSL pick-up regions, the erase gate in the erase gate pick-up regions, the storage gate in the storage gate pick-up regions and the first and second first S/D regions in the bitline pick-up regions; and
forming via contacts in the via openings.

7. The method of claim 5 comprises forming silicide contacts on the common S/D region in the WLSL pick-up regions, on the first and second access gates in WLSL pick-up regions, on the first and second storage gate conductors in the first and second storage gate pick-up regions, on first and first second S/D regions in the bitline pick-up regions and on the erase gate in the erase gate pick-up regions.

8. The method of claim 1 wherein each of the first and second storage gate conductors comprises:
a floating gate conductor;
a control gate conductor disposed over the floating gate conductor; and
a storage gate dielectric disposed between the floating gate and control gate conductors.

9. The method of claim 1 comprises:
forming a first S/D region in the substrate adjacent to the first access gate conductor of a first memory cell of each memory cell pair of the row of memory cell pairs; and
forming a second first S/D region adjacent to the second access gate conductor of a second memory cell of each memory cell pair of the row of memory cell pairs.

10. The method of claim 1 wherein the row of the memory cell pairs comprises a plurality of WLSL pick-up regions distributed along the row of memory cell pairs.

11. The method of claim 1 wherein an adjacent access gate conductor of an adjacent row of the memory cell pairs is disposed adjacent to the first access gate conductor comprises a normal displacement distance $D_N$ in non-WLSL pick-up regions and an extended displacement distance $D_E$ in the WLSL region, wherein $D_E$ is greater than $D_N$.

12. A method for forming a device comprising:
providing a substrate prepared with a memory cell region with memory cell pairs arranged in rows in a row direction and columns in a column direction, an array isolation region separating the rows and columns of the memory cell pairs, wherein:
each row of memory cell pairs comprises
first access gate conductors of first memory cells of the row of memory cell pairs,
first storage gate conductors of first memory cells of the row of memory cell pairs, second storage gate conductors of second memory cells of the row of memory cell pairs, second access gate conductors of the second memory cells of the row of memory cell pairs, a common second source/drain (S/D) region disposed between the first and second storage gate conductors, the common second S/D region extends a length of the row to form a common buried source line (SL) of the row of memory cell pairs, and first S/D regions disposed adjacent to the first and second access gate conductors at locations of memory cell pairs;

a wordline and SL (WLSL) pick-up region in the row of memory cell pairs, wherein the first storage gate conductor includes first and second storage gate crossovers for coupling to the second storage gate conductor, the crossovers create a displacement area in the WLSL pick-up region without the first storage gate conductor, the first access gate conductor is offset towards the common buried SL in the displacement area to form a first offset access gate conductor, and an adjacent access gate conductor of the first access gate conductor of an adjacent row of memory cell pairs adjacent to the first offset access gate conductor comprises a normal displacement distance $D_N$ in a non-WLSL region and an extended displacement distance $D_E$ in the WLSL region, wherein $D_E$ is greater than $D_N$.

13. The method of claim 12 wherein:

an erase gate is disposed over the common buried SL;

an erase gate dielectric is disposed between the buried SL;

a storage gate sidewall dielectric isolates the erase gate from the storage gate conductors; and the erase gate and erase gate dielectric are removed in the WLSL pick-up region to expose the buried SL.

14. The method of claim 12 wherein each of the first and second storage gate conductors of each row of the memory cell pairs comprises:

a floating gate conductor;

a control gate conductor disposed over the floating gate conductor; and a storage gate dielectric disposed between the floating gate and control gate conductors.

15. The method of claim 12 wherein the row of the memory cell pairs further comprises:

a control gate pick-up region;

an erase gate pick-up region; and wherein the control gate and erase gate pick-up regions are disposed in locations along the row of the memory cell pairs which are different from the location of the WLSL pick-up region.

16. The method of claim 12 wherein the first S/D regions of the memory cell pairs serve as bitline pick-up regions.

17. A device comprising:

first and second storage gate conductors of a row of memory cell pairs disposed on the substrate disposed in a row direction, wherein the first storage gate conductor comprises first and second crossover regions at a first and second sides of a WLSL pick-up region in the row direction, wherein the first and second crossover regions comprise the first storage gate conductor crossing over to merge with the second storage gate conductor, the WLSL pick-up region is devoid of the first storage gate conductor;

a common S/D region disposed in the substrate between adjacent storage gate conductor sidewalls the first and second storage gate conductors, the common S/D region extends continuously a length of the row of the memory cell pairs and serves as a common source line (SL) of the row of the memory cell pairs; and first and second access gate conductors disposed on the substrate adjacent to non-adjacent storage gate conductor sidewalls of the first and second storage gate conductors, the first access gate conductor follows a sidewall profile of the non-adjacent sidewall of the first storage gate conductor and includes a first offset in the WLSL pick-up region which is adjacent to the common S/D region, the first offset is created by the absence of the first storage gate conductor in the WLSL pick-up region.

18. The device of claim 17 wherein:

an erase gate is disposed over the common SL, the erase gate comprises a discontinuation at the first and second crossover regions;

an erase gate dielectric is disposed between the common SL and the erase gate;

a storage gate sidewall dielectric isolates the erase gate from the storage gate conductors; and wherein the discontinuation of the erase gate leaves the common SL uncovered by the erase gate in the WLSL pick-up region.

19. The device of claim 17 wherein an adjacent access gate conductor of an adjacent row of memory cell pairs is disposed adjacent to the first access gate conductor and comprises a normal displacement distance $D_N$ in non-WLSL pick-up regions and an extended displacement distance $D_E$ in the WLSL region, wherein $D_E$ is greater than $D_N$.

20. The device of claim 17 wherein the row of memory cell pairs further comprises:

first and second storage gate pick-up regions;

an erase gate pick-up region; and wherein the first and second storage gate and erase gate pick-up regions are disposed in different locations along the row of the memory cell pairs which are different from the location of than the WLSL pick-up region.

* * * * *